United States Patent [19]
Saurer et al.

[11] Patent Number: 5,482,570
[45] Date of Patent: Jan. 9, 1996

[54] PHOTOVOLTAIC CELL

[75] Inventors: Eric Saurer, Bevaix; Michael Grätzel, St-Sulpice; Tobias Meyer, Féchy, all of Switzerland

[73] Assignee: Asulab S.A., Bienne, Switzerland

[21] Appl. No.: 204,395

[22] PCT Filed: Jul. 24, 1993

[86] PCT No.: PCT/EP93/01980

§ 371 Date: Jun. 22, 1994

§ 102(e) Date: Jun. 22, 1994

[87] PCT Pub. No.: WO94/03930

PCT Pub. Date: Feb. 17, 1994

[30] Foreign Application Priority Data

Jul. 29, 1992 [FR] France ................................. 9209507

[51] Int. Cl.$^6$ .................................................. H01L 31/06
[52] U.S. Cl. .......................... 136/255; 136/256; 136/263; 257/465
[58] Field of Search ............................ 136/255, 256, 136/263; 257/465

[56] References Cited

U.S. PATENT DOCUMENTS

| | | | |
|---|---|---|---|
| 4,532,537 | 7/1985 | Kane | 257/458 |
| 4,554,727 | 11/1985 | Deckman et al. | 437/2 |
| 4,732,621 | 3/1988 | Murata et al. | 136/256 |
| 4,851,658 | 7/1989 | Murata et al. | 250/214.1 |

FOREIGN PATENT DOCUMENTS 102204  3/1984  European Pat. Off. ............... 136/259

OTHER PUBLICATIONS

Technical Digest of the International PVSEC-5 26 Nov. 1990, Kyoto, Japan pp. 701–704 Hezel et al. "Advantages of Textured Multicrystalline Silicon for MIS Inversion Layer Solar Cells".
Patent Abstracts of Japan vol. 12, No. 118 (E–600) 13 Apr. 1988 & JPA62 247 574 (Sanyo Electric Company Ltd) 28 Oct. 1987.
Patent Abstracts of Japan vol. 10, No. 39 (E–381) 15 Feb. 1986 & JPA60 195 979 (Handoutai Enerugii Kenkyusho KK) 4 Oct. 1985.
Patent Abstracts of Japan vol. 12, No. 49 (E–582) 13 Feb. 1988 & JPA62 198 169 (Fuji Electric Corp Res & Dev Ltd) 1 Sep. 1987.

*Primary Examiner*—Aaron Weisstuch
*Attorney, Agent, or Firm*—Griffin, Butler, Whisenhunt & Kurtossy

[57] ABSTRACT

The invention relates to a photovoltaic cell (1) comprising a substrate (2) having a support face (4) having a first electrode (6) thereon and a second electrode (10) spaced from the first electrode (6) by a plurality of layers (14, 16; 14, 24, 16) including at least one layer (14) of a semiconducting material with an active junction (J) interface thereat, said active junction (J) having a developed surface area greater than its projected surface area.

40 Claims, 3 Drawing Sheets

II, III, IV, V, VI

PHOTOVOLTAIC CELL

FIELD OF THE INVENTION

The invention relates to a photovoltaic cell and more specifically to a cell of this type comprising a junction exhibiting a high roughness factor.

BACKGROUND OF THE INVENTION

The transformation of light energy into electrical energy using photovoltaic cells has been known for a long time and these cells are currently used in various electronic devices such as watches, calculators, cameras and the like.

These cells can be divided into four main types, namely metal-semiconductor (MS) junction cells of the Schottky diode type, metal-insulator-semiconductor (MIS) junction cells, semiconductor-insulator-semiconductor (SIS) junction cells, and homojunction or heterojunction cells.

The term junction is understood to mean the transition zone between a metal and a semiconductor or between two semiconductors of different types of conductivity.

In all known thin layer photovoltaic cells the semiconducting material used is always deposited in the form of a thin continuous and smooth layer on the surface of a substrate previously covered by a first transparent electrode made, for example, of metal. This layer of semiconducting material is then covered, depending on the type of cell, by one or more layers (semiconducting and/or insulating and/or conducting), the upper most layer forming the second electrode.

Although developments and improvements have been made to these photovoltaic cells over the last few years to improve their efficiency, this efficiency still remains relatively modest.

Moreover, the manufacture of these cells requires the use of materials of great purity and thus the use of sophisticated equipment installed in clean rooms, so that these cells still remain difficult to produce.

OBJECTS AND SUMMARY OF THE INVENTION

It is thus a main object of the invention to overcome the disadvantages of the above-mentioned prior art by providing a photovoltaic cell exhibiting a high rate of conversion of the energy of incident light into electrical energy per unit of surface and which is, moreover, simple to manufacture.

The object of the invention is therefore a photovoltaic cell comprising a substrate having a support face on which there is disposed a first electrode, a second electrode insulated from the first electrode by a plurality of layers having at least a first layer of a semiconducting material with an active junction at an interface thereof, characterised in that said active junction exhibits a developed surface area greater than its projected surface area.

This characteristic greatly increases the efficiency of collection of incident photons in relation to the cells of the prior art. This increase is essentially due to the multiple diffusion of the light in the semiconducting layer in association with the large active junction. The structure of the cell of the invention thus provides an improved efficiency per unit of surface area.

According to an advantageous feature of the invention, said active junction exhibits a roughness factor greater than 20.

It will be noted in this connection that the roughness factor is defined by the ratio between the real surface area and the projected surface area.

According to a first embodiment of the invention, said support face exhibits a developed surface area greater than its projected surface area and all said other layers extend successively on said support face.

This embodiment notably has the advantage of being simple since it only needs one mechanical or chemical treatment of the substrate.

According to a second embodiment of the invention, the first electrode exhibits a developed surface area greater than its projected surface area and all said other layers extend successively on said electrode.

According to a third embodiment of the invention, said first layer of semiconducting material exhibits a developed surface area greater than its projected surface area and all said other layers extend successively on said first layer of semiconducting material.

According to another advantageous feature of the invention common to the second and to the third embodiment, said first electrode or the first layer of semiconducting material comprises a layer formed of colloidal particles.

This feature endows the active junction with a very high effective surface and thus also a very high effective surface area/projected surface area ratio which can reach a value of the order of 2000.

This layer also enables the minority carriers produced within it by the incident photons to reach the junction before any recombination of these carriers occurs and consequently to produce a photovoltaic cell which makes the best use of the energy supplied by the photons from the incident light.

BRIEF DESCRIPTION OF THE DRAWINGS

Other features and advantages of the invention will emerge from study of the description of embodiments of the photovoltaic cell of the invention given by way of non-limiting illustration in connection with the appended drawings in which.

DETAILED DESCRIPTION OF THE INVENTION

The invention will now be described in an application to metal-semiconductor junction photovoltaic cells of the Schottky type (MS) or heterojunction or homojunction semiconductor-semiconductor photovoltaic cells in connection with FIGS. 1 to 6 and then in an application to metal-insulator-semiconductor (MIS) junction photovoltaic cells or semiconductor-insulator-semiconductor (SIS) photovoltaic cells in connection with FIGS. 7 to 12.

The principle of operation of these large families of photovoltaic cells is well known to the person skilled in the art and reference will therefore only be made thereto in the following description where there is a connection between this principle and the invention. Reference may notably be made to the work entitled "Microelectronic Devices" by Edward S. Yang for an explanation of the physical phenomena used in photovoltaic cells.

Figure 1:
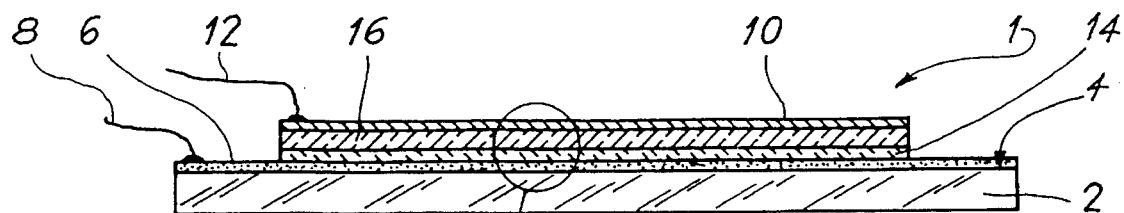
FIG. 1 represents diagrammatically and in section a first type of photovoltaic cell according to the invention.
Figure 2:
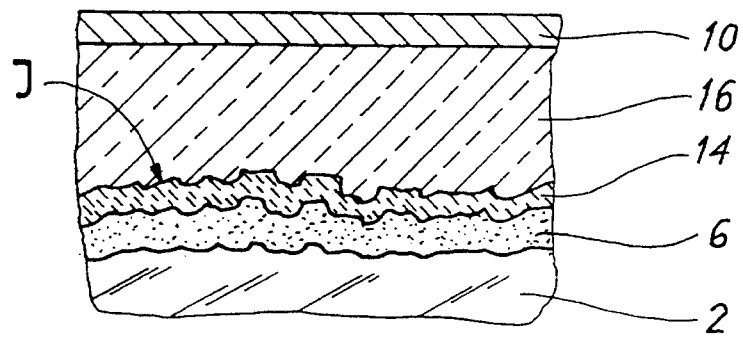
FIGS. 2 to 6 are, respectively, partially enlarged views of the cell of FIG. 1 according to various embodiments of the invention.

Referring first of all to FIG. 1, this shows a first type of photovoltaic cell according to the invention designated by the general reference numeral 1.

The photovoltaic cell 1 comprises a substrate 2 having on the entire surface of one of its major faces 4, termed a support face, a first electrode 6 connected to a first conductor 8. The cell 1 comprises a second electrode 10 connected to a second conductor 12, separated from the first electrode 6 by a first layer 14 of a semiconducting material and a layer 16 of a different material. Depending on the type of photovoltaic cell envisaged and as will emerge in the following description, the material of this layer 16 can either be an electronic conductor (MS cell) or a semiconductor (homojunction or heterojunction type cell). This layer will hereinafter be referred to as a conducting layer or second layer of semiconducting material, depending on the type of cell being described.

The term electronic conducting layer naturally also refers to a layer made of organic electronic conducting material and the term semiconducting materials refers both to inorganic semiconducting materials and to organic semiconductors.

The first layer 14 of semiconducting material is in direct contact with the first electrode 6 and together with the layer 16 produces an active junction designated J in FIGS. 2 to 5 and 8 to 10.

The first electrode 6 is preferably made in the form of a thin layer of the order of 10 to 500 nanometers in thickness. The electrode 6 is advantageously made of a material chosen from the group consisting of tin oxide doped with fluorine, antimony or arsenic, indium oxide doped with tin oxide, aluminium stannate, and zinc oxide doped with aluminium.

The person skilled in the art may of course choose any other equivalent transparent electronic conducting layer.

The nature of the second electrode 10 depends on the nature of the layer 16 and can be omitted if the latter is electrically conducting. If the layer 16 is not conducting, the second electrode 10 should preferably be made in the form of a thin layer of a material such as gold or aluminium or of a material exhibiting analogous electrical conductivity properties.

Either the substrate 2 and the first electrode or the second electrode 10 are of course transparent to photons of the relevant spectral range.

It will be noted that the figure does not reflect the exact dimensions of the cell formed in this manner, these dimensions having been greatly exaggerated for reasons of clarity.

According to the invention, the active junction J exhibits a developed surface area greater than its projected surface area.

In a first embodiment of the invention, the support face 4 of the substrate 2 exhibits a developed surface area greater than its projected surface area. The following layers which extend successively on the substrate 2 closely embrace the configuration in relief of the support face 4 in such a way that the texture of the face 4 of the substrate 2 results in the active junction J having a developed surface area greater than its projected surface area.

Care should of course also be taken to ensure that the layer forming the electrode 6 as well as the first layer 14 are of a thickness such that the developed surface area of the active junction J is substantially equal to that of the support face 4 of the substrate.

The support face 4 preferably exhibits a roughness factor greater than 20 and typically a roughness factor of the order of 100, making it possible to obtain a cell having a relatively large efficacy of light collection by multiple diffusion of the light in relation to the cells of the prior art.

The appropriate roughness factor of this support face 4 can be obtained simply, for example by abrasion or also by chemical attack. If the substrate 2 is made of an organic material, the roughness factor of the support face may, for example, be obtained by moulding.

The other layers are successively deposited in a conventional manner for example by vapor phase chemical deposition or by physical deposition in a vacuum.

Figure 3:
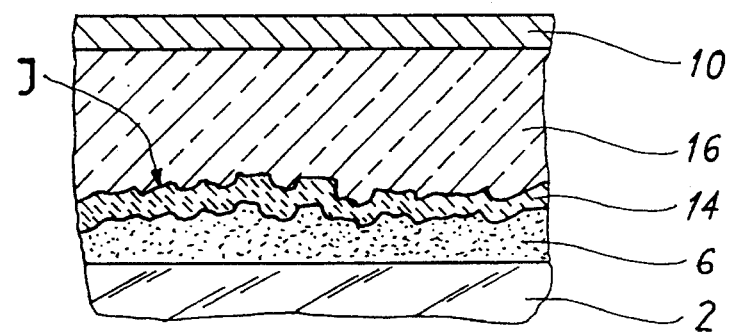

According to a second embodiment of the invention shown in FIG. 3, and in contradistinction to the first embodiment, the support surface 4 is smooth and it is the face of the first electrode 6 opposite this face 4 which has a rough appearance. The other layers, in particular the first layer 14 of semiconducting material, extend successively on the first electrode 6 and closely embrace its relief. Here, too, the roughness factor is advantageously greater than 20 and preferably of the order of 100.

To obtain this roughness factor, the first electrode 6 can for example be deposited by tangential evaporation in a vacuum (the substrate being inclined by 3° to 20° in relation to the direction of evaporation), the other layers being conventionally deposited as has already been indicated hereinabove.

Figure 4:
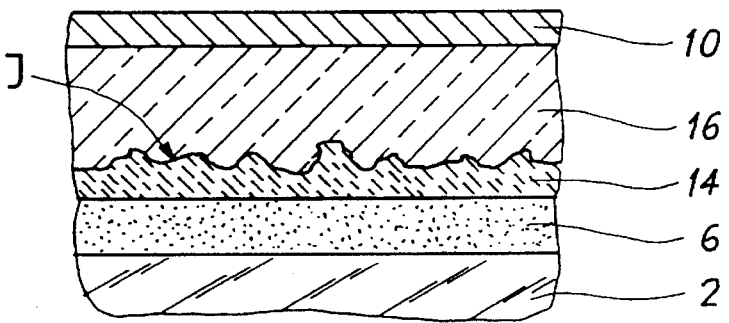

According to a third embodiment, shown in FIG. 4, the support face 4 of the substrate 2 and the first electrode 6 do not exhibit a special roughness factor, but the face of the first layer 14 of semiconducting material which is in contact with the layer 16, that is the active junction J, is rough and advantageously exhibits a roughness factor greater than 20 and preferably of the order of 100.

According to this embodiment, the first layer 14 of semiconducting material can, for example, be deposited by tangential evaporation in a vacuum.

Figure 5:
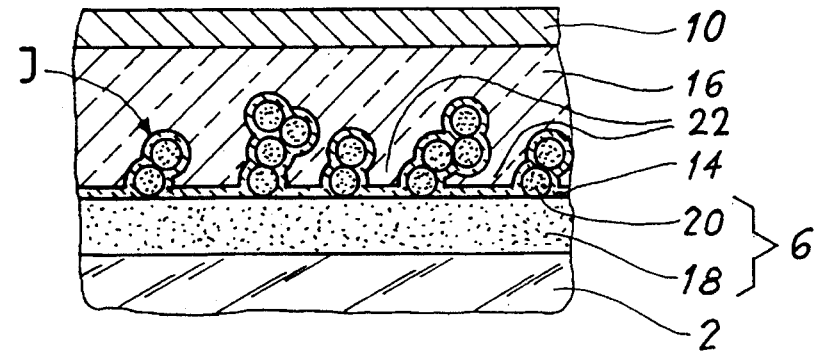

Reference now being made to FIG. 5, this shows another embodiment of the cell of the invention in which the first electrode 6 comprises a uniform layer 18 formed of a conducting material, such as those described hereinabove, on which a layer of colloidal particles 20 of the same material is, for example, deposited by a sol-gel process. The following layers are successively deposited on the electrode 6 as described hereinabove.

The layer 18 typically exhibits a thickness within a range extending from 15 to 150 nanometers and the colloidal particles 20 preferably exhibit a diameter of 1 to 200 nanometers. These particles are agglomerated and form a porous layer the thickness of which is between 0.1 and 20 micrometers at the surface of the substrates.

This therefore makes it possible to produce a first layer 14 of semiconducting material and thus an active junction exhibiting an active surface area/projected surface area ratio of the order of 2000 and consequently a cell having a very high active surface.

For this embodiment to provide maximum efficiency, care must be taken to ensure that the first layer 14 of semiconducting material has a thickness lower than or equal to half the width of the pores 22 formed by the particles 20, otherwise the pores 22 become blocked, thereby considerably reducing the roughness factor of the active junction J.

Figure 6:
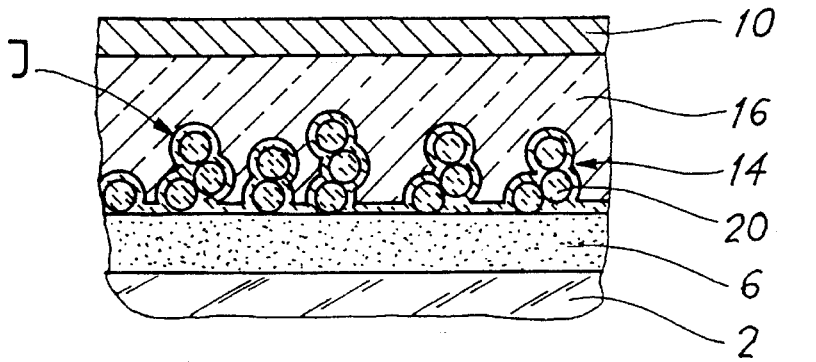
Figure 7:
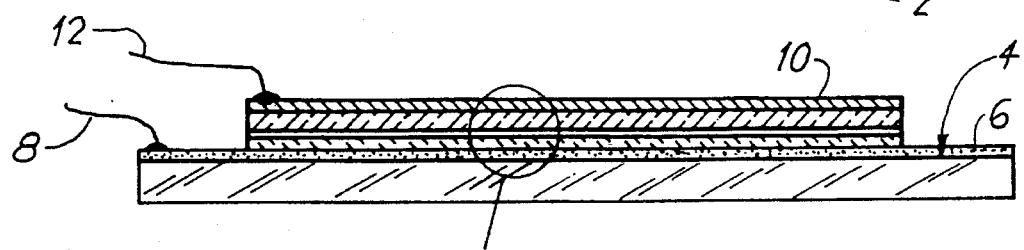
FIG. 7 shows diagrammatically and in section a second type of photovoltaic cell according to the invention.
Figure 8:
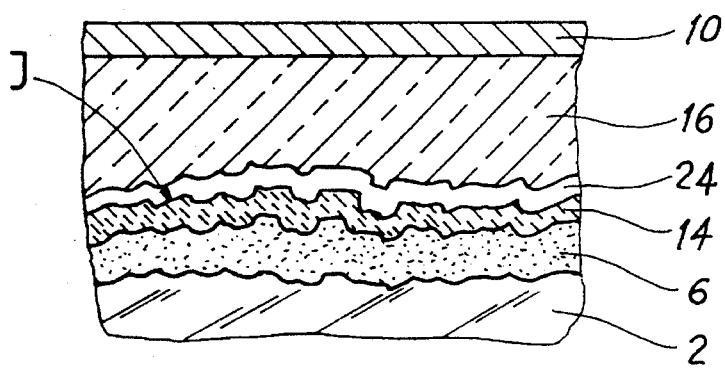
FIGS. 8 to 12 are respectively partially enlarged views of the cell of FIG. 7 according to various embodiments of the invention.
Figure 9:
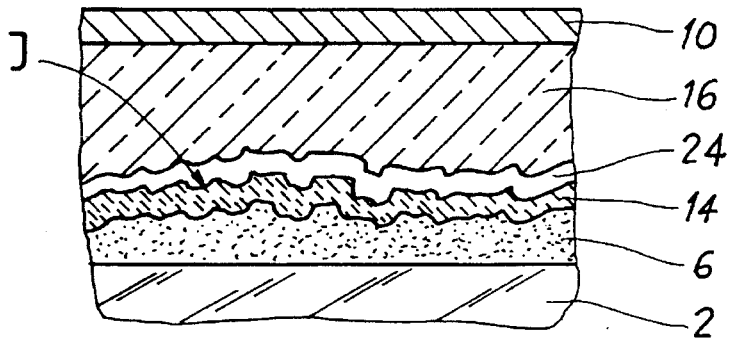
Figure 10:
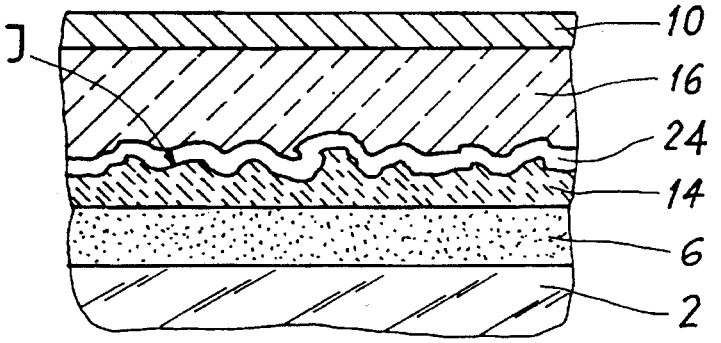

According to a fifth embodiment, shown in FIG. 6, the support face 4 of the substrate 2 and the first electrode 6 do not exhibit any special roughness, but the first layer 14 of semiconducting material comprises a layer formed of colloidal particles 20 on which the following layers are deposited.

In this case, the size of the particles 20 and the thickness of the layer formed by the particles have a considerable effect on the response of the cell to excitation by incident light.

The particles of the layer absorb the photons, the energy of which is equal to or exceeds the difference in energy between the conduction band and the valence band of the material of the particles. This absorption of light leads to the creation of electron-hole pairs in the particles. With, for example, a layer 14 made of a semiconducting material such as n type $TiO_2$, the electrons are the majority carriers whereas the holes are the minority carriers. Thus, when a semiconductor/metal junction cell, or a semiconductor/semiconductor junction cell of this type is used to create electricity from absorbed light, it is necessary for the holes to be able to diffuse up to this junction before they can combine with the electrons. In other words, the diffusion length of the minority carriers, designated by $1_{pm}$, must be larger than the distance which these carriers have to travel before reaching the junction.

This diffusion length is defined by $$1_{pm}=(2D\tau)^{0.5}$$

in which $\tau$ is the life time of a hole and D is the diffusion constant of the minority carriers. By way of example, the value of $1_{pm}$ is 100 nanometers for $TiO_2$.

The diameter of the colloidal particles 20 must thus preferably be less than the diffusion length of the minority carriers for there to be a great probability that these carriers will reach the semiconductor/metal or semiconductor/semiconductor junction and to thereby achieve an effective separation of the charge carriers and a high efficiency of conversion is increased.

Reference now being made to FIGS. 7 to 12, these show various embodiments of metal-insulator-semiconductor (MIS) semiconductor-insulator-semiconductor (SIS) junction photovoltaic cells according to the invention, in which the elements identical to those described in connection with FIGS. 1 to 6 are designated by the same reference numerals.

As may be clearly seen in FIGS. 7 to 12, the structure of these photovoltaic cells does not differ from the cells described in connection with FIGS. 1 to 6 except that one layer 24 of an insulating material extends between the first layer 14 of semiconducting material and the layers 16 and 10 which are thereabove, regardless of the nature of these layers 16 and 10.

The layer 24 of insulating material advantageously exhibits a thickness between 1 and 50 nanometers. In any case, the thickness of this layer must permit injection by the tunnel effect of electrons of the first layer 14 of semiconducting material into the layer 16 forming the second layer of semiconducting material, in the case of an SIS cell or into the metal layer in the case of an MIS cell.

The first layer 14 of semiconducting material can be made of an inorganic semiconducting material. The same applies to the layer 16 in the case of an SIS cell.

Figure 11:
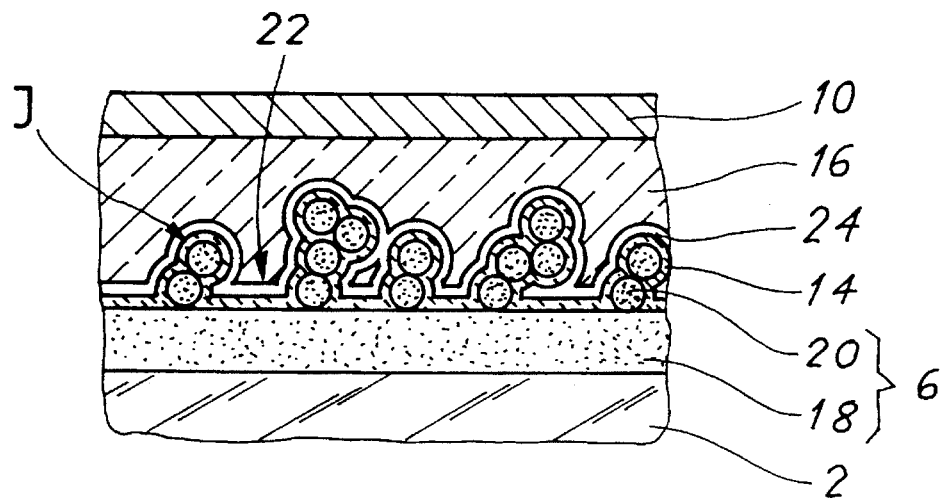
Figure 12:
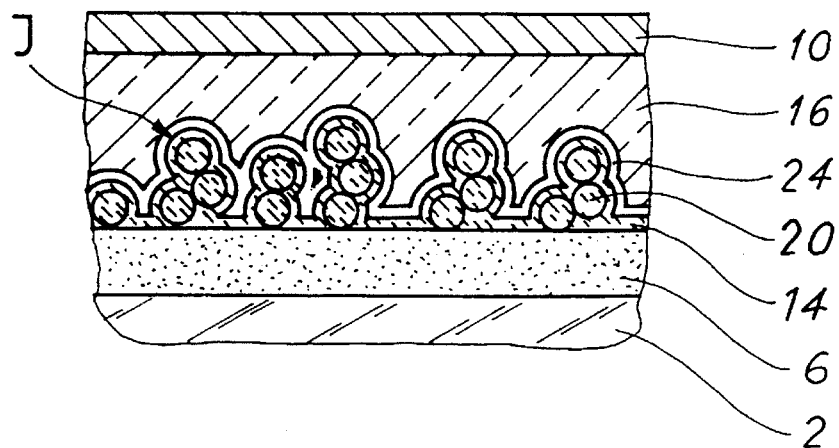

Nevertheless, in the case of the embodiment of the cell according to the invention shown in FIG. 11, care should be taken, as shown in FIG. 5, that the first layer 14 of semiconducting material has a thickness less than or equal to half the dimension of the pores 22 formed by the particles 20, otherwise these pores 22 become blocked, thereby considerably reducing the roughness factor.

The semiconducting material constituting the layers 14 (MS, MIS, SIS, homojunction and heterojunction cells) and/or 16 (SIS, homojunction and heterojunction cells) which have just been described can be chosen from amongst the semiconducting materials included in the following four groups:

The first group consists of oxides of the transition elements, oxides of the elements of columns 13 and 14 of the modern periodic classification and lanthanide oxides (see Cours de chimie physique by Paul Arnaud, published by Dunod 1988).

The second group consists of mixed oxides formed of a mixture of two or more oxides of the first group.

The third group consists of mixed oxides formed of a mixture of one or more oxides of the first group with oxides of the elements of columns 1 and 2 of the modern periodic classification.

The fourth group is formed of the group of semiconducting materials consisting of:

silicon, silicon hydride, silicon carbide, germanium, cadmium sulphide, cadmium telluride, zinc sulphide, lead sulphide, iron sulphide, zinc and cadmium sulphide, zinc selenide, gallium arsenide, indium phosphide, gallium phosphide, cadmium phosphide, titanium fluoride, titanium nitride, zirconium fluoride, zirconium nitride, doped diamond, copper thiocyanate, and pure and mixed chalcopyrites.

The semiconducting material is preferably chosen from the group of materials consisting of titanium oxide, lanthanum oxide, zirconium oxide, niobium oxide, tungsten oxide, strontium oxide, calcium/titanium oxide, sodium titanate, and potassium niobate.

According to a particular embodiment of the invention, the layers 14 and/or 16 can be made of an organic semiconducting material.

The organic semiconducting material constituting these layers 14 and/or 16 can be chosen from the semiconducting materials of the group consisting of phthalocyanines (hereinafter designated Pc), 2,9-dimethyl quinacridone, 1,1-bis (4-di-p-polylaminophenyl) cyclohexane, phthalocyanine bisnaphthalocyanine, poly(N-vinylcarbazole), polyanthracenes, polyphenols, polysilanes, poly(p-phenylene) vinylene, porphyrins, perylene and its derivatives, poly-(benzo[C]thiophene)=poly(isothianaphthene), polythiophene, poly(3-methylthiophene), poly(3-octylthiophene), polyaniline, poly(p-phenylene), poly(thiophene)vinylene, polyacetylene, polyazulene, and diacetylenes.

The organic semiconducting material is preferably chosen from the group of materials consisting of $H_2Pc$, MgPc doped with $O_2$, CuPc, ZnPc, FePc, SiPc, NiPc, Al(Cl)Pc, Al(OH)Pc, $LuPc_2$ doped with dichlorocyanoquinone, tetra-4-terbutylphthalocyanino silicon dichloride, LuPc2:2,2'6,6'-tetraphenyl-4-4'((p-dimethylaminostyryl)- 4H-pyrane and 5,10,15,20-tetra(3-pyridyl) porphyrine, LuPc, and $NiPc:I_2$.

Of course, the semiconducting material can have an n or p conductivity type depending on the type of cell proposed.

The conducting layer 16 in the case of MS or MIS cells can be made of a material chosen from the group of metals consisting of platinum, ruthenium, rhodium, palladium, iridium, silver, osmium, gold, platinum, aluminum, indium, magnesium, and conducting oxides of the elements of columns 8 to 10 of the modern periodic classification.

According to a variant, the conducting layer 16 of MS or MIS cells can be formed by a conducting polymer advantageously selected from the group consisting of poly(benzo [C]thiophene), poly(isothianaphthene), polythiophene, poly(3-methylthiophene), poly(3-octylthiophene), polyaniline, poly(p-phenylene), poly(thiophene)vinylene, polyacetylene, polyazulene, diacetylenes, and doped and undoped phthalocyanines.

In the metal-insulator-semiconductor (MIS) or semiconductor-insulator-semiconductor (SIS) photovoltaic junction cells of the invention, the layer of insulating material 24 can be made of a material chosen from a first group consisting of aluminum oxide, silicon oxide, zirconium oxide, yttrium oxide, lanthanum oxide, aluminum oxyfluoride, cubic boron nitride, diamond, a second group of metal oxides having a forbidden band greater than 3.5 eV, and a third group of insulating polymers consisting of polyimide, polymetamethylacrylate, polyethylene, polypropylene, polystyrene, and polysilanes.

It will be noted that, according to the invention, it is possible to obtain a transparent or almost transparent photovoltaic cell by means of judicious selection of the various materials used to produce the cell.

We claim:

1. A photovoltaic cell comprising a substrate having a support face having disposed thereon a first electrode and a second electrode separated from the first electrode by a plurality of layers comprising at least a first layer of a semiconducting material with an active junction at an interface thereof, said active junction having a developed surface area greater than its projected surface area, said first electrode comprising a uniform layer formed of a conducting material and a porous layer formed of conducting colloidal particles, which has a developed surface area greater than its projected surface area and on which the other layers and said second electrode are disposed successively, and said first layer of semiconducting material having a thickness less than or equal to half the width of the pores of said porous layer.

2. A cell according to claim 1, wherein said active junction exhibits a roughness factor greater than 20.

3. A cell according to claim 1, wherein said conducting colloidal particles have a diameter between 1 and 200 nanometers.

4. A cell according to claim 1, wherein said layer formed of conducting colloidal particles has a thickness between 0.1 and 20 micrometers.

5. A cell according to claim 1, wherein said plurality of layers comprises, apart from said first layer of semiconducting material, a conducting layer which extends between said first layer of semiconducting material and said second electrode.

6. A cell according to claim 5, wherein said plurality of layers also comprises a layer of insulating material extending between said first layer of semiconducting material and said conducting layer.

7. A cell according to claim 6, wherein the layer of insulating material is made of a material selected from a first group consisting of aluminum oxide, silicon oxide, zirconium oxide, yttrium oxide, lanthanum oxide, aluminum oxyfluoride, cubic boron nitride, diamond, a second group consisting of metal oxides having a forbidden band greater than 3.5 eV, and a third group consisting of polyimide, polymetamethylacrylate, polyethylene, polypropylene, polystyrene, and polysilanes.

8. A cell according to claim 5, wherein said second electrode is formed by said conducting layer.

9. A cell according to claim 5, wherein the conducting layer is made of a material selected from a first group consisting of poly(benzo[C]thiopene), poly(isothianaphthene), polythiophene, poly(3-methylthiophene), poly(3-octylthiophene), polyaniline, poly(p-phenylene), poly(thiophene)vinylene, polyacetylene, polyazulene, diacetylenes, and doped or undoped phthalocyanines and a second group consisting of platinum, ruthenium, rhodium, palladium, iridium, osmium, silver, gold, platinum, aluminum, indium, magnesium, and conducting oxides of the elements of columns 8 to 10 of the modern periodic classification.

10. A cell according to claim 1, wherein said plurality of layers comprises, apart from said first layer of semiconducting material, a second layer of semiconducting material of a different type of conductivity from that of the first layer of semiconducting material and which extends between said first layer and the second electrode.

11. A cell according to claim 10, wherein said plurality of layers also comprises a layer of insulating material extending between said first layer of semiconducting material and said second layer of semiconducting material.

12. A cell according to claim 10, wherein said first layer of a semiconducting material and/or said second semiconducting layer is (are) made of an inorganic semiconducting material.

13. A cell according to claim 10, wherein said first layer of semiconducting material and/or said second layer of semiconducting material is (are) made of an organic semiconducting material.

14. A cell according to claim 13, wherein said first layer of semiconducting material and/or said second layer of semiconducting material is (are) made of a semiconducting material selected from the group of doped and/or undoped semiconducting materials consisting of phthalocyanines, 2,9-dimethyl quinacridone, 11-bis (4-di-p-tolylaminophenyl) cyclohexane, phthalocyanine bisnaphthalocyanine, poly (N-vinylcarbazole), polyanthracenes, polyphenols, polysilanes, poly (p-phenylene) vinylene, porphyrins, perylene and its derivatives, poly(benzo[C]thiophene, poly(isothianaphthene), polythiophene, poly(3-methylthiophene), poly(3-octylthiophene), polyaniline, poly(p-phenylene), poly(thiophene)vinylene, polyacetylene, polyazulene, and diacetylenes.

15. A cell according to claim 13, wherein said first layer of semiconducting material and/or said second layer of semiconducting material is (are) made of a semiconducting material selected from the group of semiconducting materials consisting of $H_2Pc$, MgPc doped with $O_2$, CuPc, ZnPc, FePc, SiPc, NiPc, Al(Cl)Pc, Al (OH)Pc, $LuPc_2$ doped with dichlorocyanoquinone, tetra-4-tert-butylphthalocyanino silicon dichloride, LuPc:2,2'6,6'-tetraphenyl- 4,4'(p-dimethylaminostyryl) 4H-pyrane and 5,10,15,20-tetra (3-pyridyl)porphyrin, LuPc, and NiPc: $I_2$.

16. A cell according to claim 10, wherein said first layer of semiconducting material and/or said second layer of semiconducting material is (are) made of a semiconducting material selected from semiconducting materials formed of a first group consisting of semiconducting oxides of the transition elements, semiconducting oxides of the elements of columns 13 and 14 of the modern periodic classification and semiconducting lanthanide oxides, a second group consisting of mixed semiconducting oxides formed of a mixture of two or more oxides of the first group, a third group consisting of mixed semiconducting oxides formed of a mixture of one or more oxides of the first group with oxides of the elements of columns 1 and 2 of the modern periodic classification, and a fourth group consisting of silicon, silicon hydride, silicon carbide, germanium, cadmium sulphide, cadmium telluride, zinc sulphide, lead sulphide, iron sulphide, zinc selenide, gallium arsenide, indium phosphide, gallium phosphide, cadmium phosphide, titanium fluoride, titanium nitride, zirconium fluoride, zirconium nitride, doped diamond, copper thiocyanate, and pure and mixed chalcopyrites.

17. A cell according to claim 16, wherein the semiconducting material is selected from the group of materials consisting of titanium oxide, lanthanum oxide, zirconium oxide, niobium oxide, tungsten oxide, strontium oxide, calcium/titanium oxide, sodium titanate, and potassium niobate.

18. A cell according to claim 1, wherein the first electrode is made of a material chosen from the group consisting of tin oxide doped with fluorine, antimony or arsenic, aluminum stannate, and zinc oxide doped with aluminum.

19. A cell according to claim 1, wherein said first layer of a semiconducting material is made of an inorganic semiconducting material.

20. A cell according to claim 1, wherein said first layer of semiconducting material is made of an organic semiconducting material.

21. A photovoltaic cell comprising a substrate having a support face having disposed thereon a first electrode and a second electrode separated from the first electrode by a plurality of layers comprising at least a first layer of a semiconducting material with an active junction at an interface thereof, said active junction having a developed surface area greater than its projected surface area, said first layer of semiconducting material comprising a porous layer formed of colloidal particles and having a developed surface area greater than its projected surface area and a uniform layer covering said porous layer and on which the other layers and said second electrode are disposed successively, and said colloidal particles having a diameter smaller than the diffusion length of minority charge carriers created in said porous layer by the absorption of light.

22. A cell according to claim 21, wherein said active junction exhibits a roughness factor greater than 20.

23. A cell according to claim 21, wherein said colloidal particles have a diameter between 1 and 200 nanometers.

24. A cell according to claim 21, wherein said layer formed of colloidal particles has a thickness between 0.1 and 20 micrometers.

25. A cell according to claim 21, wherein said plurality of layers comprises, apart from said first layer of semiconducting material, a conducting layer which extends between said first layer of semiconducting material and said second electrode.

26. A cell according to claim 25, wherein said plurality of layers also comprises a layer of insulating material extending between said first layer of semiconducting material and said conducting layer.

27. A cell according to claim 26, wherein the layer of insulating material is made of a material selected from a first group consisting of aluminum oxide, silicon oxide, zirconium oxide, yttrium oxide, lanthanum oxide, aluminum oxyfluoride, cubic boron nitride, diamond, a second group consisting of metal oxides having a forbidden band greater than 3.5 eV, and a third group consisting of polyimide, polymetamethylacrylate, polyethylene, polypropylene, polystyrene, and polysilanes.

28. A cell according to claim 25, wherein said second electrode is formed by said conducting layer.

29. A cell according to claim 25, wherein the conducting layer is made of a material selected from a first group consisting of poly(benzo[[C]thiophene), poly(isothianaphthene), polythiophene, poly(3-methylthiophene), poly(3-octylthiophene), polyaniline, poly(p-phenylene), poly(thiophene)vinylene, polyacetylene, polyazulene, diacetylenes, and doped or undoped phthalocyanines and a second group consisting of platinum, ruthenium, rhodium, palladium, iridium, osmium, silver, gold, platinum, aluminum, indium, magnesium, and conducting oxides of the elements of columns 8 to 10 of the modern periodic classification.

30. A cell according to claim 21 wherein said plurality of layers comprises, apart from said first layer of semiconducting material, a second layer of semiconducting material of a different type of conductivity from that of said first layer of semiconducting material and which extends between said first layer and the second electrode.

31. A cell according to claim 30 wherein said plurality of layers also comprises a layer of insulating material extending between said first layer of semiconducting material and said second layer of semiconducting material.

32. A cell according to claim 30, wherein said first layer of a semiconducting material and/or said second semiconducting layer is (are) made of an inorganic semiconducting material.

33. A cell according to claim 32, wherein said first layer of semiconducting and/or said second layer of semiconducting material is (are) made of a semiconducting material selected from semiconducting materials formed of a first group consisting of semiconducting oxides of the transition elements, semiconducting oxides of the elements of columns 13 and 14 of the modern periodic classification and semiconducting lanthanide oxides, a second group consisting of mixed semiconducting oxides formed of a mixture of two or more oxides of the first group, a third group consisting of mixed semiconducting oxides formed of a mixture of one or more oxides of the first group with oxides of the elements of columns 1 and 2 of the modern periodic classification, and a fourth group consisting of silicon, silicon hydride, silicon carbide, germanium, cadmium sulphide, cadmium telluride, zinc sulphide, lead sulphide, iron sulphide, zinc selenide, gallium arsenide, indium phosphide, gallium phosphide, cadmium phosphide, titanium fluoride, titanium nitride, zirconium fluoride, zirconium nitride, doped diamond, copper thiocyanate, and pure and mixed chalcopyrites.

34. A cell according to claim 33, wherein the semiconducting material is selected from the group of materials consisting of titanium oxide, lanthanum oxide, zirconium oxide, niobium oxide, tungsten oxide, strontium oxide, calcium/titanium oxide, sodium titanate, and potassium niobate.

35. A cell according to claim 30, wherein said first layer of semiconducting material and/or said second layer of semiconducting material is (are) made of an organic semiconducting material.

36. A cell according to claim 35, wherein said first layer of semiconducting material and/or said second layer of semiconducting material is (are) made of a semiconducting material selected from the group of doped and/or undoped semiconducting materials consisting of phthalocyanines, 2,9-dimethyl quinacridone, 1,1-bis(4-di-p-tolylaminophenyl) cyclohexane, phthalocyanine bisnaphthalocyanine, poly(N-vinylcarbazole), polyanthracenes, polyphenols, polysilanes, poly(p-phenylene)vinylene, porphyrins, perylene and its derivatives, poly(benzo[C]thiophene), poly(isothianaphthene), polythiophene, poly(3-methylthiophene), poly(3-octylthiophene), polyaniline, poly(p-phenylene), poly(thiophene)vinylene, polyacetylene, polyazulene, and diacetylenes.

37. A cell according to claim 35, wherein said first layer of semiconducting material and/or said second layer of semiconducting material is (are) made of a semiconducting material selected from the group of semiconducting materials consisting of $H_2Pc$, MgPc doped with $O_2$, CuPc, ZnPc, FePc, SiPc, NiPc, Al(Cl)pc, Al(OH)Pc, $LuPc_2$ doped with dichlorocyanoquinone, tetra-4-tert-butylphthalocyanino silicon dichloride, LuPc:2,2' 6,6'-tetraphenyl-4,4'(p-dimethylaminostyryl)4H-pyrane and 5,10,15,20-tetra(3-pyridyl)porphyrin, LuPc, and $NiPc:I_2$.

38. A cell according to claim 21, wherein the first electrode is made of material chosen from the group consisting of tin oxide doped with fluorine, antimony or arsenic, aluminum stannate, and zinc oxide doped with aluminum.

39. A cell according to claim 21, wherein said first layer of a semiconducting material is made of an inorganic semiconducting material.

40. A cell according to claim 21, wherein said first layer of semiconducting material is made of an organic semiconducducting material.

* * * * *